(12) United States Patent
Han

(10) Patent No.: US 7,943,977 B2
(45) Date of Patent: May 17, 2011

(54) IMAGE SENSOR AND METHOD FOR MANUFACTURING THE SAME THAT USES THERMOELECTRIC DEVICE FOR COOLING

(75) Inventor: Chang-Hun Han, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 411 days.

(21) Appl. No.: 12/046,114

(22) Filed: Mar. 11, 2008

(65) Prior Publication Data
US 2008/0224188 A1 Sep. 18, 2008

(30) Foreign Application Priority Data
Mar. 14, 2007 (KR) .................. 10-2007-0024906

(51) Int. Cl.
*H01L 23/38* (2006.01)
*H01L 21/8238* (2006.01)
(52) U.S. Cl. . 257/292; 257/461; 257/713; 257/E23.082; 438/64; 438/122; 438/527
(58) Field of Classification Search ............ 257/E23.082
See application file for complete search history.

(56) References Cited

U.S. PATENT DOCUMENTS

| 6,559,538 B1 * | 5/2003 | Pomerene et al. ............ 257/712 |
| 2003/0183267 A1 | 10/2003 | McIntyre et al. |
| 2006/0000500 A1 * | 1/2006 | Sauciuc et al. ................ 136/201 |

FOREIGN PATENT DOCUMENTS

| CN | 1319896 | 10/2001 |
| EP | 1148558 A2 * | 10/2001 |
| KR | 1020010090151 | 10/2001 |
| KR | 1020060002046 | 1/2006 |

* cited by examiner

Primary Examiner — Stephen W Smoot
(74) Attorney, Agent, or Firm — Sherr & Vaughn, PLLC

(57) ABSTRACT

An apparatus that can effectively operate in high temperatures including a CMOS image sensor, a thermoelectric semiconductor formed under the CMOS image sensor for selectively cooling the image sensor and a heat sink formed under the thermoelectric semiconductor.

8 Claims, 5 Drawing Sheets

Figure 1:
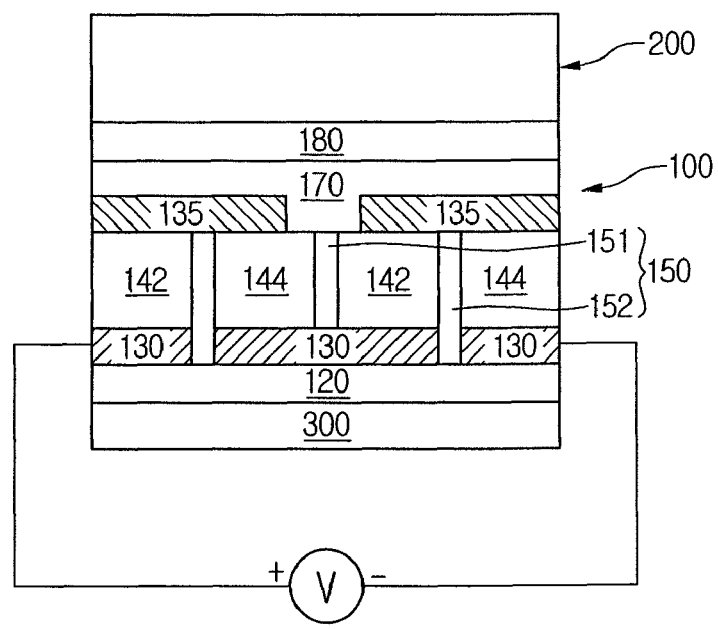

IMAGE SENSOR AND METHOD FOR MANUFACTURING THE SAME THAT USES THERMOELECTRIC DEVICE FOR COOLING

The present application claims priority under 35 U.S.C. 119 to Korean Patent Application No. 10-2007-0024906, filed Mar. 14, 2007, which is hereby incorporated by reference in its entirety.

BACKGROUND

An image sensor is a semiconductor device that converts an optical image into an electrical signal. The image sensor may be classified as a charge coupled device (CCD) and a complementary metal oxide silicon (CMOS) image sensor (CIS).

The CCD is noted in having complicated driving process and excessive power consumption. Because it requires numerous photo steps, the CCD has a complicated manufacturing process. Accordingly, use of the CIS has been provided to overcome such disadvantages of the CCD.

A CIS may include a photodiode and a metal oxide silicon (MOS) transistor in each unit pixel to sequentially detect electrical signals of the respective unit pixels in a switching mode, thereby realizing an image. The CIS may also include a photodiode region and a transistor region. The photodiode region serves to receive an optical signal and convert the optical signal into an electrical signal that is processed by the transistor region. While the CIS may overcome disadvantages of the CCD, it has disadvantages such as the creation of noise due to a dark current. Like leakage current, the dark current tends to rapidly increase in correspondence to increases in temperature.

SUMMARY

Embodiment relate to an image sensor and a method for manufacturing the same which prevents occurrences of dark current due to an increase in temperature.

Embodiments relate to an image sensor that can include at least one of the following: a complementary metal oxide semiconductor image sensor; a cooling device formed under the complementary metal oxide semiconductor image sensor for selectively cooling the complementary metal oxide semiconductor image sensor; and a heat sink formed under the cooling device.

Embodiments relate to a method for manufacturing an image sensor that can include at least one of the following steps: forming a complementary metal oxide semiconductor image sensor; forming a direct current, PN junction thermoelectric device under the complementary metal oxide semiconductor image sensor for selectively cooling the complementary metal oxide semiconductor image sensor; and then forming a cooling apparatus under the cooling device.

Embodiments relate to an image sensor that can include at least one of the following: a CMOS image sensor image sensor; a thermoelectric semiconductor formed under the CMOS image sensor for selectively cooling the CMOS image sensor, the thermoelectric semiconductor including a plurality of N-type conductive layers and a plurality of P-type conductive layers extending between an upper conducting layer and a lower conducting layer electrically connecting the N-type conduction layers and the P-type conduction layers, and an insulating layer interposed between a respective N-type conductive layer and a respective P-type conductive layer; a heat sink formed under the thermoelectric semiconductor; and a sensing mechanism for sensing and controlling the temperature of at least one of the thermoelectric semiconductor, the CMOS image sensor and the heat sink.

DRAWINGS

Example FIG. 1 illustrates an image sensor in accordance with embodiments.

Example FIGS. 2 to 12 illustrate methods of manufacturing an image sensor, in accordance with embodiments.

DESCRIPTION

Hereinafter, an image sensor and a method for manufacturing the same in accordance with embodiments will be described in detail with reference to the accompanying drawings. In the description, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being "between" two layers, it can be the only layer between the two layers, or one or more intervening layers may also be present.

As illustrated in example FIG. 1, an image sensor in accordance with embodiments can include complementary metal oxide semiconductor (CMOS) image sensor 200, cooling device 100 formed under CMOS image sensor 200, and cooling apparatus 300 such as a heat sink formed under cooling device 100.

Cooling device 100 can be formed as a thermoelectric semiconductor, such as a direct current PN junction thermoelectric semiconductor. If cooling device 100 is formed as a thermoelectric semiconductor, such a thermoelectric semiconductor 100 can include first conductive type conduction layer 142 and second conductive type conduction layer 144 formed on the same plane, separation layer 150 interposed between first conductive type conduction layer 142 and second conductive type conduction layer 144, lower conduction layer 130 and upper conduction layer 135 electrically connecting first conductive type conduction layer 142 and second conductive type conduction layer 144.

Separation layer 150 can be composed of an electrical insulating material. While first conductive type conduction layer 142 and second conductive type conduction layer 144 can be formed as an N-type conduction layer and a P-type conduction layer respectively, they are not limited to such and may be composed of different materials.

The image sensor in accordance with embodiments can also include a controller for sensing and controlling the temperature of cooling device 100, CMOS image sensor 200 and cooling apparatus 300. Moreover, cooling apparatus 300 can perform a cooling function by including a flow of coolant liquid such as water and use of a cooling pan, etc.

Carrier electron absorbing heat from CMOS image sensor 200 can cool image sensor 200 by moving from P-type conduction layer 144 to N-type conduction layer 142 and by exposing the heat to cooling apparatus 300, which transfers heat away from CMOS image sensor 200. A power supply (V) can provide energy to the carrier electron to move through thermoelectric semiconductor 100.

Accordingly, the CMOS image sensor in accordance with embodiments can operate even in high temperatures by cooling the CMOS image sensor to an appropriate temperature using a thermoelectric semiconductor. Also, sensing quality can be enhanced by improving amplifying capacity due to the ability of such a CMOS image sensor to prevent occurrences of dark current in using a thermoelectric semiconductor.

FIGS. 2 to 8 are cross-sectional views of a manufacturing process of an image sensor according to a first embodiment of the present invention.

As illustrated in example FIGS. 2 to 8, a method for manufacturing an image sensor in accordance with embodiments can include forming CMOS image sensor 200, forming cooling device 100 under CMOS image sensor 200 and then forming cooling apparatus 300 under cooling device 100.

The step for forming cooling device 100 under CMOS image sensor 200 can include forming a thermoelectric semiconductor under CMOS image sensor 200. Cooling device 100 can be formed as a direct current PN junction thermoelectric semiconductor. Cooling device 100 formed as such a thermoelectric semiconductor can be formed by implanting N-type or P-type ions into P-type conduction layer or an N-type conduction layer.

Figure 2:
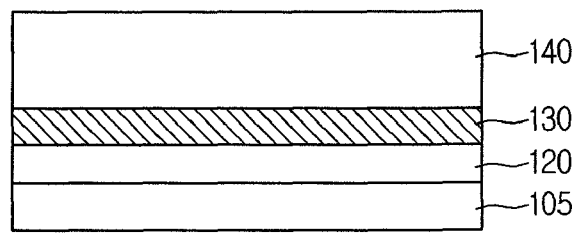

As illustrated in example FIG. 2, first insulator 120 can be formed over substrate 105. First insulator 120 can be formed as a silicon insulator over substrate 105 by oxidizing substrate 105. First insulator 120 can be an electrical insulator and/or a thermal conduction layer. First electrical conducting layer 130 and intrinsic layer 140 can then be sequentially formed over first insulator 120. Intrinsic layer 140 can be formed without any N-type impurity or P-type impurity.

Figure 3:
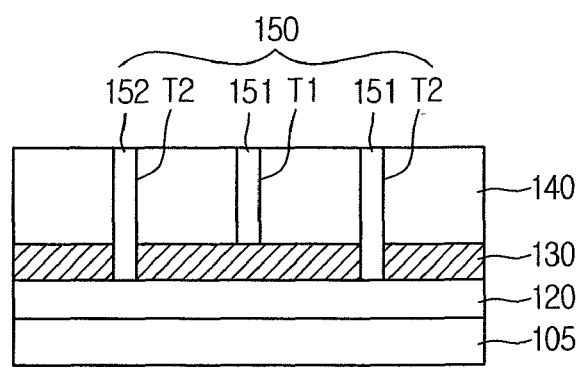

As illustrated in example FIG. 3, first trench T1 exposing the uppermost surface of first electrical conducting layer 130 can be formed by etching selectively intrinsic layer 140. First trench T1 can be formed by a wet etching process having high selectivity between first electrical conducting layer 130 and intrinsic layer 140.

A pair of second trenches T2 exposing the uppermost surface of first insulating layer 120 can be formed by etching selectively intrinsic layer 140 and first electrical conducting layer 130. Second trenches T2 can be formed by using a dry etching process having low selectivity between first electrical conducting layer 130 and intrinsic layer 140.

Separation layer 150 including a pair of first separation layers 151 and second separation layer 152 can then be formed by filling first trench T1 and second trenches T2, respectively. Separation layer 150 can be composed of an electrical insulating material.

Figure 4:
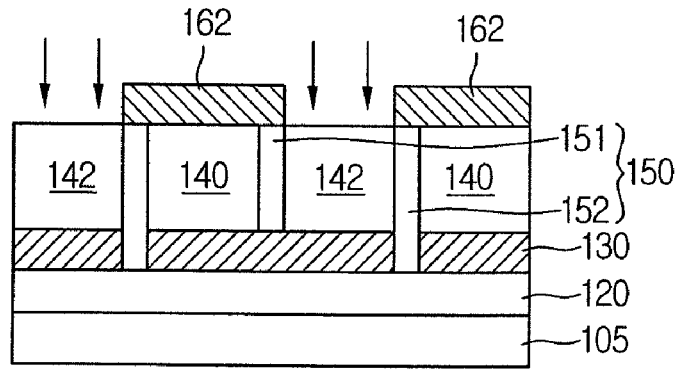

As illustrated in example FIG. 4, a pair of first conductive type conduction layers 142 can be formed in regions of intrinsic layer 140 by implanting a first conductive ion. For example, first conductive type conduction layers 142 can be formed by implanting a first conductive ion using a pair of first photo resists 162 as implanting masks. First photoresists 162 can be formed extending over separation layer 150 and a first region of intrinsic layer 140 and also over separation layer 150 and a second region of intrinsic layer 140. First conductive type conduction layer 142 can be formed as an N-type conduction layer.

Figure 5:
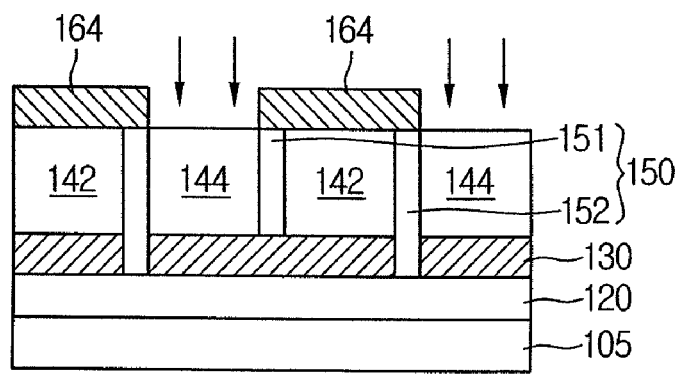

As illustrated in example FIG. 5, after removing first photo resists 162, a pair of second conductive type conduction layers 144 can then be formed in the remaining regions of intrinsic layer 140 by implanting a second conductive ion. For example, second conductive type conduction layers 144 can be formed by implanting a second conductive ion using a pair of second photo resists 164 as implanting masks. Second photoresists 164 can be formed extending over one of the first conductive type conduction layers 142 and separation layer 150 and also over separation layer 150 and the other first conductive type conduction layer 142. Second conductive type conduction layer 144 can be formed as a P-type conduction layer.

Accordingly, with this process, separation layer 150 can be interposed between first conductive type conduction layers 142 and second conductive type conduction layers 144.

Figure 6:
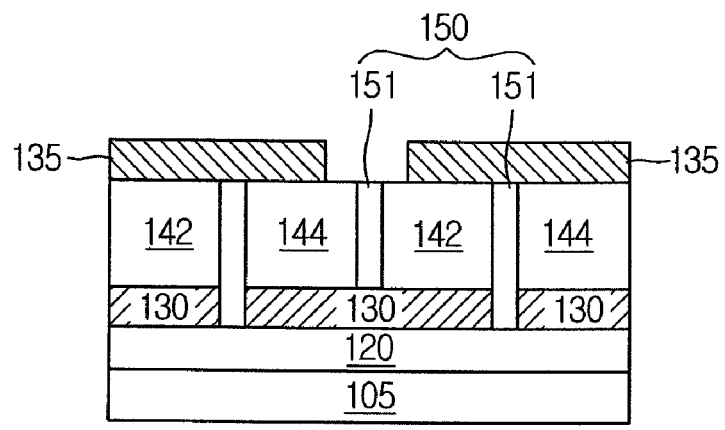

As illustrated in example FIG. 6, a pair of second electrical conducting layers 135 can then be formed to electrically connect first conductive type conduction layers 142 and second conductive type conduction layers 144. Second electrical conducting layer 135 can be formed by selectively etching second electrical conducting layer 135 formed over the substrate 105 using a third photo resist (not shown) as an etching mask.

Figure 7:
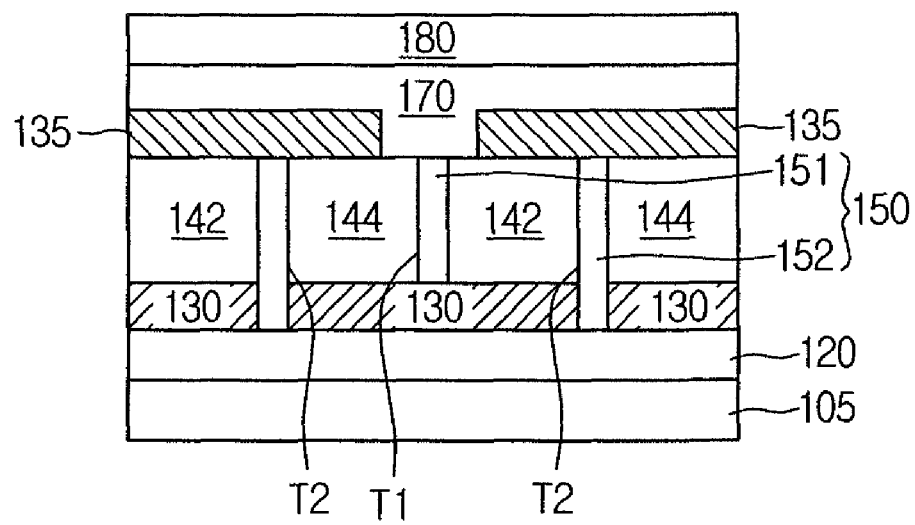

As illustrated in example FIG. 7, second insulator 170 can then be formed over substrate 105 including second electrical conducting layers 135, first conductive type conducting layer 142, second conductive type conducting layer 144 and separation layer 150. Second insulator 170 can be at least one of an electrical insulating and a thermal conductive material. Thermal absorbing plate 180 can then be formed over second insulator 170.

Figure 8:
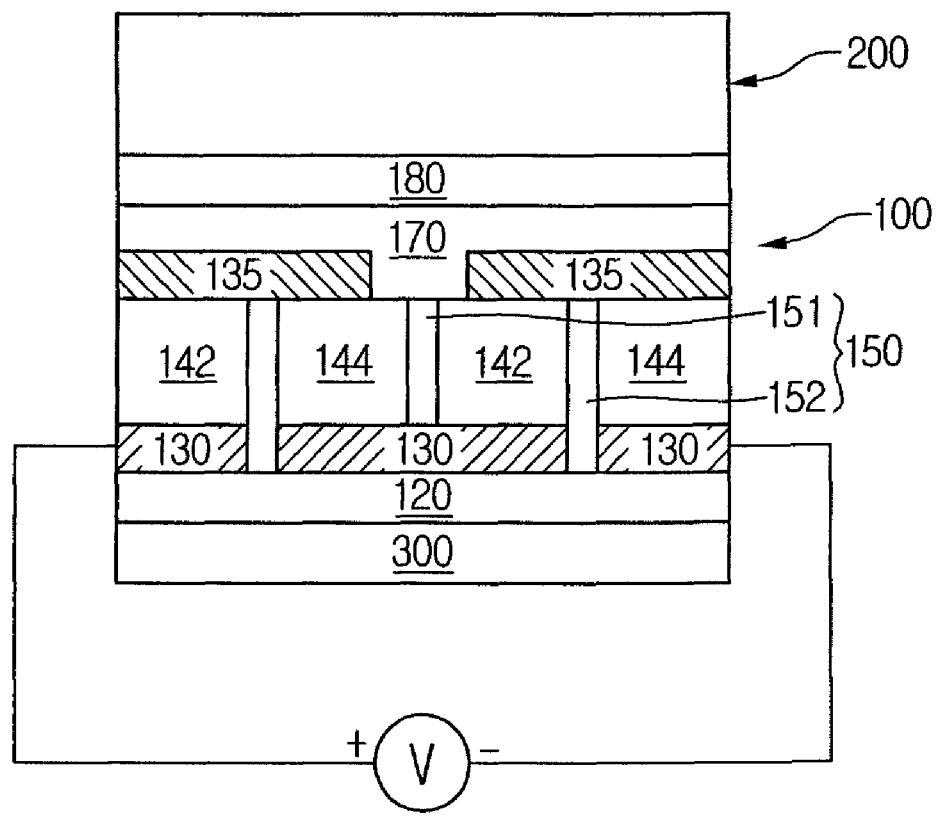

As illustrated in example FIG. 8, after removing substrate 105, cooling apparatus 300 can be formed under cooling device 100 and CMOS image sensor 200 can be formed over cooling device 100 to complete the device.

Figure 9:
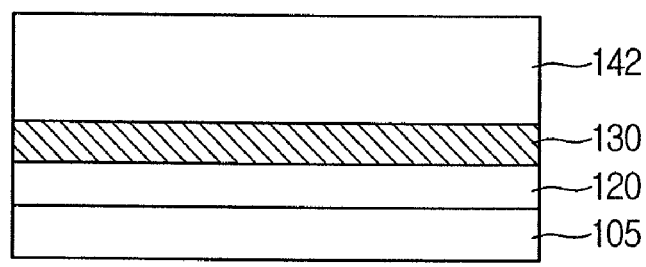
Figure 10:
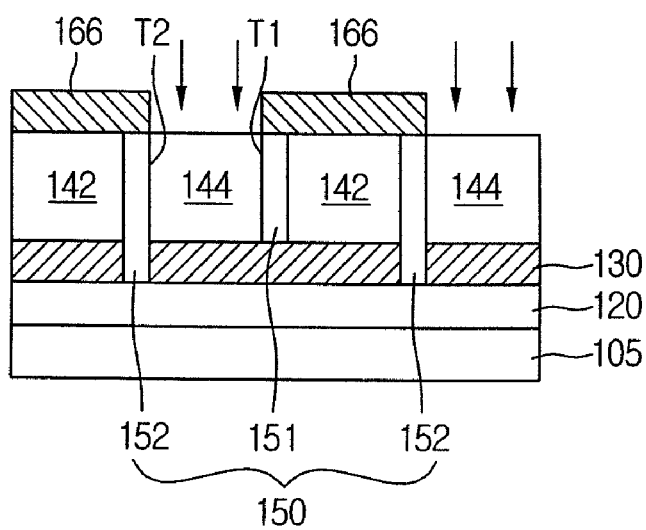

As illustrated in example FIGS. 9 and 10, an image sensor in accordance with embodiments can include forming a thermoelectric semiconductor by implanting P-type ions into an N-type conduction layer.

As illustrated in example FIG. 9, first insulator 120, first conducting layer 130 and first conductive type conduction layer 142 can be sequentially formed over substrate 105. First conductive type conduction layer 142 can be an N-type conduction layer.

As illustrated in example FIG. 10, first trench T1 and a pair of second trenches T2 can be formed by selectively etching first conductive type conduction layer 142 and first conducting layer 130. Separation layer 150 including first separation layer 151 and second separation layer 152 can then be formed by filling first trench T1 and second trenches T2. Separation layer 150 can be an electrical insulator.

Second conductive type conduction layers 144 can then be formed in two regions of first conductive type conduction layer 142 by implanting a second conductive ion using a pair of first photo resist 166 as implanting masks which selectively exposes first conductive type conduction layer 142. Accordingly, first conductive type conduction layer 142 and second conductive type conduction layer 144 can be formed including an interposing separation layer 150.

Figure 11:
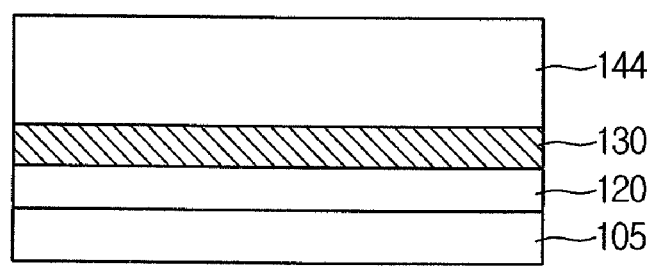
Figure 12:
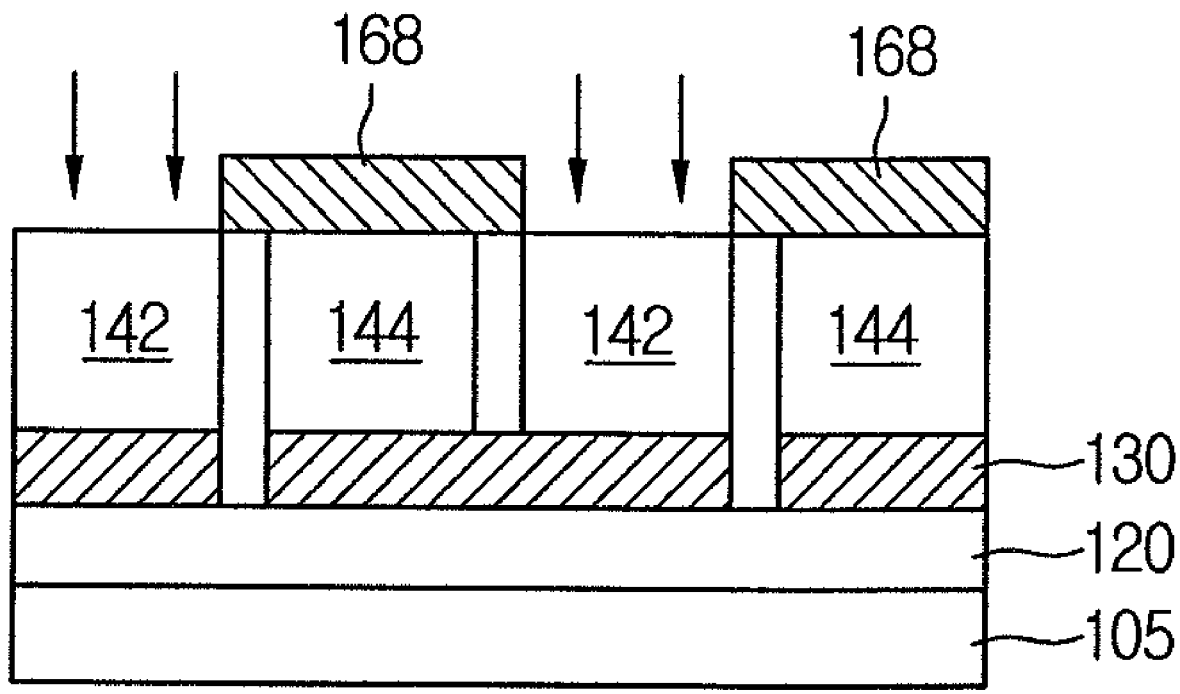

As illustrated in example FIGS. 11 and 12, an image sensor in accordance with embodiments can include forming the thermoelectric semiconductor by implanting N-type ions into a P-type conduction layer.

As illustrated in example FIG. 11, first insulator 120, first electrical conducting layer 130 and second conductive type conduction layer 144 can be sequentially formed over substrate 105. Second conductive type conduction layer 144 can be a P-type conduction layer.

As illustrated in example FIG. 12, first trench T1 and a pair of second trenches T2 can be formed by selectively etching second conductive type conduction layer 144 and first electrical conducting layer 130. Separation layer 150 including first separation layer 151 and second separation layer 152 can then be formed by filling first trench T1 and second trenches T2. Separation layer 150 can be an electrical insulator.

First conductive type conduction layers 142 can then be formed in two regions of second conductive type conduction layer 144 by implanting a first conductive ion using a pair of photo resists 168 as implanting masks which selectively exposes second conductive type conduction layer 144. Accordingly, first conductive type conduction layer 142 and second conductive type conduction layer 144 can be formed with an interposing separation layer 150.

Accordingly, a CMOS image sensor and a method of manufacturing the same in accordance with embodiments can operate even in high temperatures by cooling the CMOS image sensor to an appropriate temperature using a thermoelectric semiconductor.

Because such a CMOS image sensor prevents occurrences of dark current using a thermoelectric semiconductor, the CMOS image sensor can enhance sensing quality by improving amplifying capacity.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
    a complementary metal oxide semiconductor image sensor;
    a cooling device formed under the complementary metal oxide semiconductor image sensor for selectively cooling the complementary metal oxide semiconductor image sensor; and
    a heat sink formed under the cooling device,
    wherein the cooling device comprises a direct current, PN junction thermoelectric semiconductor,
    wherein the direct current, PN junction thermoelectric semiconductor comprises:
        a first conduction layer composed of a first conductive type material, a second conduction layer adjacent to the first conduction layer and composed of a second conductive type material, a third conduction layer adjacent the second conduction layer and composed of the first conductive type material, and a fourth conduction layer adjacent the third conduction layer and composed of the second conductive type material;
        a separation layer interposed between adjacent conduction layers;
        a lower conducting layer electrically connecting the conduction layers; and
        an upper conducting layer provided over and in contact with the first, second, third and fourth conduction layers,
    wherein the first conductive type material comprises an N-type material and the second conductive type material comprises a P-type material,
    wherein the lower conducting layer is provided under and in contact with the first, second, third and fourth conduction layers,
    wherein the upper conducting layer comprises:
        a first upper conducting layer provided over and in contact with the first and second conduction layers; and
        a second upper conducting layer provided over and in contact with the third and fourth conduction layers,
    wherein the lower conducting layer comprises:
        a first lower conducting layer provided under and in contact with the first conduction layer;
        a second lower conducting layer provided under and in contact with the second and third conduction layers;
        a third lower conducting layer provided under and in contact with the fourth conduction layer;
        a lower insulator layer provided between the lower electrical conducting layer and the heat sink; and
        an upper insulator layer provided between the upper conducting layer and the CMOS image sensor, and
    wherein the upper insulator layer is provided over and in contact with the second and third conduction layers and the first and second upper conducting layers.

2. The apparatus of claim 1, further comprising a thermal absorbing plate provided between the upper insulator layer and the CMOS image sensor.

3. A method comprising:
    forming a complementary metal oxide semiconductor image sensor;
    forming a direct current, PN junction thermoelectric device under the complementary metal oxide semiconductor image sensor for selectively cooling the complementary metal oxide semiconductor image sensor; and
    forming a cooling apparatus under the cooling device,
    wherein forming the direct current, PN junction thermoelectric semiconductor comprises:
        forming a lower insulating layer over a substrate;
        sequentially forming a lower conducting layer and an intrinsic layer over the lower insulating layer;
        etching the intrinsic layer and the lower conducting layer exposing portions of the lower insulating layer and also exposing a portion of the first conducting layer;
        forming a separation layer over the exposed portions of the lower insulating layer and the exposed portion of the lower conducting layer;
        forming a pair of alternating first conduction layers in the intrinsic layer by implanting a conductive ion having a first conductive type; and then
        forming a pair of alternating second conduction layers in the intrinsic layer by implanting a conductive ion having a second conductive type.

4. The method of claim 3, wherein forming the direct current, PN junction thermoelectric semiconductor further comprises:
    forming an upper conducting layer over the first and second conduction layers to electrically connect the first and second conduction layers.

5. The method of claim 4, wherein the separation layer is interposed between the first and second conduction layers.

6. A method comprising,
    forming a complementary metal oxide semiconductor image sensor;
    forming a direct current, PN junction thermoelectric device under the complementary metal oxide semiconductor image sensor for selectively cooling the complementary metal oxide semiconductor image sensor; and
    forming a cooling apparatus under the cooling device,
    wherein forming the direct current, PN junction thermoelectric semiconductor comprises:
        forming a lower insulating layer over a substrate;
        sequentially forming a lower conducting layer and a first conduction layer having a first conductive type over the lower insulating layer;
        etching the first conduction layer and the lower conducting layer exposing portions of the lower insulating layer and also exposing a portion of the lower conducting layer;
        forming a separation layer over the exposed portions of the lower insulating layer and the exposed portion of the lower conducting layer; and then
        forming a pair of alternating second conduction layers in the first conduction layer by implanting a conductive ion having a second conductive type using a mask exposing the first conduction layer.

7. The method of claim 6, wherein the separation layer is interposed between the first and second conduction layers.

8. The method of claim 6, wherein the conductive ion having a first conductive type comprises an N-type ion and the conductive ion having a second conductive type comprises a P-type ion.

* * * * *